United States Patent
Kenichi

(10) Patent No.: US 8,598,638 B2
(45) Date of Patent: Dec. 3, 2013

(54) SOLID-STATE IMAGE CAPTURING ELEMENT AND ELECTRONIC INFORMATION DEVICE

(75) Inventor: Nagai Kenichi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 711 days.

(21) Appl. No.: 12/724,728

(22) Filed: Mar. 16, 2010

(65) Prior Publication Data

US 2010/0237390 A1    Sep. 23, 2010

(30) Foreign Application Priority Data

Mar. 17, 2009    (JP) .................................... 2009-65317

(51) Int. Cl.
*H01L 31/062* (2012.01)

(52) U.S. Cl.
USPC .......................................... 257/290; 257/292

(58) Field of Classification Search
USPC ................................................ 257/290–292
See application file for complete search history.

(56) References Cited

U.S. PATENT DOCUMENTS

| | | | |
|---|---|---|---|
| 2006/0022232 A1 | 2/2006 | Lim | |
| 2007/0235781 A1* | 10/2007 | Fujita et al. | .................. 257/292 |
| 2009/0050997 A1 | 2/2009 | Mutoh | |

FOREIGN PATENT DOCUMENTS

| | | |
|---|---|---|
| JP | 6-97406 A | 4/1994 |
| JP | 11-284166 | 10/1999 |
| JP | 2002-231926 A | 8/2002 |
| JP | 2003-31787 | 1/2003 |
| WO | 2008029772 A1 | 3/2008 |

* cited by examiner

*Primary Examiner* — Samuel Gebremariam
(74) *Attorney, Agent, or Firm* — Nixon & Vanderhye P.C.

(57) ABSTRACT

A solid-state image capturing element according to the present invention includes a one conductivity type semiconductor substrate; an opposite conductivity type well region formed on the one conductivity type semiconductor substrate; a photodiode section formed on the opposite conductivity type well region, constituted of a plurality of one conductivity type regions with successively different impurity concentrations for complete electric charge transferring; a one conductive drain region capable of reading out signal charges from the photodiode section; and a transfer gate formed above a substrate between the one conductivity drain region and the photodiode section.

18 Claims, 7 Drawing Sheets

SOLID-STATE IMAGE CAPTURING ELEMENT AND ELECTRONIC INFORMATION DEVICE

This nonprovisional application claims priority under 35 U.S.C. §119(a) to Patent Application No. 2009-065317 filed in Japan on Mar. 17, 2009, the entire contents of which are hereby incorporated by reference.

BACKGROUND OF THE INVENTION

1. Field of the Invention

The present invention is related to a solid-state image capturing element, such as a MOS solid-state image capturing element, constituted of a semiconductor element for performing a photoelectric conversion on and capturing an image of image light from a subject, and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing element as an image input device used in an image capturing section thereof.

2. Description of the Related Art

The conventional MOS solid-state image capturing element of this kind is capable of being driven by a single power supply with low electric power consumption, thereby economically far more advantageous compared to a CCD solid-state image capturing element. However, the MOS solid state image capturing element has a small electric potential modulation under a transfer gate owing to a low power supply voltage. Owing to this fact, the MOS solid state image capturing element has a disadvantage of difficulty in complete electric charge transferring of signal charges from a photodiode PD of a light receiving section to a floating diffusion FD, the light receiving section being for performing a photoelectric conversion on incident light and generating the signal charges.

In order to solve the problem, Reference 1 proposes a way of providing a channel constituting layer under a transfer gate to improve controllability of the degree of electric potential modulation, thereby achieving the complete electric charge transferring.

FIG. 12 is a longitudinal cross sectional view schematically illustrating an exemplary essential part structure of the conventional solid-state image capturing element disclosed in Reference 1.

In FIG. 12, a conventional solid-state image capturing element 100 includes a well region 102, in which, for example, p-type impurities are diffused, formed on a silicon substrate 101. The impurity concentration of the well region 102 is as low as the order of E15 (E15 being 10 to the power of fifteen). N-type impurities are injected into the well region 102 as a photodiode 103 to form an n-type region 103a. A p+ surface layer 103b is formed on the n-type region 103a for the protection thereof. The photodiode 103 is constituted of the n-type region 103a and the p+ surface layer 103b.

A detection node section 104 is formed by the injection of the n-type impurities next to the photodiode 103 with the well area 102 of a predetermined distance in the surface direction interposed therebetween. A transfer gate 105, which constitutes a reading transistor for accumulating and reading signals, is formed on a substrate between the detection node section 104 and the n-type area 103a. The transfer gate 105 has a positional structure extending over the n-type area 103a and the detection node section 104, thereby constituting a MOS transistor with the detection node section 104 as a drain area and the n-type area 103a as a source area. Such a MOS transistor is capable of allowing signal charges X generated in the n-type area 103a to flow towards the detection node section 104 by controlling the voltage of the gate electrode 105. In the case where a gate of an amplifying transistor, for example, is connected to the detection node section 104, the signal charges X from the photodiode 103 can be provided to the gate of the amplifying transistor as a detection voltage by the controlling of the transfer gate 105.

In addition, a channel stop region 106 for separating elements is formed in a substrate surrounding an element area, being from the photodiode 103 through under the transfer gate 105 to the detection node section 104, as a unit pixel area. In addition, a channel implant (n-type penetration channel layer 107) is formed in the channel region under the transfer gate 105 and in an upper surface region of the detection node section 104, for setting a threshold value of the transfer gate 105 and the detection node section 104.

An element separating region is defined as the channel stop region 106 (high concentration p-type layer) herein; however, the element separating region may be separated by a LOCOS (Local Oxidation of Silicon) region, which is a thick oxide layer. In FIG. 12, the channel stop region 106 is represented by a high concentration p-type layer.

The concentration of the impurities in the n-type region 103a is at an intermediate level between the impurity concentration of the well region 102 and the impurity concentration of the p+ surface layer 103b. Further, since it is necessary to accumulate the signal charges, which are generated in the photodiode 103, in the n-type region 103a, it is necessary to set them to a positive electric potential. However, doing so will result in the extension of a depletion layer to a surface (upper surface) the n-type region 103a, definitely. When the depletion layer reaches the surface (upper surface) of the n-type region 103a, leakage current increases. This leads to the increase of the display irregularity during a dark instance. Therefore, it is necessary to design the impurity concentration of the p+ surface layer 103b formed on the surface (upper surface) of the n-type region 103a to be the highest.

In such a structure of the p+ surface layer 103b, the n-type region 103a is formed by a complete depletion. Therefore, the signal charges X generated by a photoelectric conversion corresponding to the amount of light received in the n-type region 103a, are accumulated in the substrate without being leaked.

The high concentration p+ surface layer 103b extends to below the transfer gate 105 definitely by heat treatment after ion implantation in a semiconductor manufacturing process. Therefore, once the high concentration p+ surface layer 103b extends to below the transfer gate 105, it becomes impossible to increase the electric potential below the transfer gate 105 even by applying a predetermined voltage to the transfer gate 105 to excite a channel layer below the transfer gate 105 (state of electrical conduction) by a high concentration p region. As a result, it becomes highly difficult to easily read out the signal charges X from the photodiode 103.

Further, if the channel length L of the transfer gate 105 is shortened by the low concentration p well region 102, the depletion layer extends from the n-type region 103a, which corresponds to a source region, and the detection node section 104, which corresponds to a drain region, resulting in punch-through.

If punch-through occurs in the transfer gate 105, a "channel length modulation effect (drain modulation effect)" occurs, which is the phenomenon of the electric potential of the drain region (detection node section 104) modulating the channel electric potential. As a result, problems occur, such as the worsening of the linearity of the signal light quantity and the electric charge output characteristics.

Thus, in a unit cell (unit pixel section) of the conventional solid-state image capturing element 100 comprising: the p-type well region 102 formed on the silicon substrate 101; the photodiode 103 constituted of the n-type region 103a and the high concentration p+ surface layer 103b; the transfer gate 105 proximal to the photodiode 103; and the detection node section 104 proximal to the other side of the transfer gate 105, it is structured such that a p-type barrier layer 108 is formed in the substrate below the transfer gate 105, the p-type barrier layer 108 having a higher concentration than the p-type well region 102, and further, the n-type region 103a and the n-type penetration channel layer 107 are included, n-type penetration channel layer 107 being formed below the transfer gate 105 proximal to the n-type area 103a.

That is, in order not to cause the channel length modulation effect (drain modulation effect) or punch-through, the p-type barrier layer 108, which is the same type as the p-type well region 102 and has a higher concentration than the p-type well region 102, is provided below the transfer gate 105 and the p-type barrier layer 108 is provided in such a manner to be connected to both the n-type region 103a and the detection node section 104, herein. As a result, the depletion layers extending from both the n-type region 103a and the detection node section 104 can be suppressed. In addition, owing to the influence of the high concentration p-type barrier layer 108, there is a possibility of not being capable of reading out the signal charges of the n-type region 103a. As a countermeasure, a channel forming layer 109 is provided on the upper side of the p-type barrier layer 108. The channel forming layer 109 is positioned at the upper side of the p-type barrier layer 108 and is formed such that a part thereof protrudes from the n-type region 103a to below the transfer gate 105. The space of the channel forming layer 109 is small, and it occupies a proximal location in a part of the substrate below the transfer gate 105 and also in the n-type region 103a.

With the structure as described above, the channel forming layer 109 acts as part of a signal reading path 110, thereby securing the signal reading path 110. Therefore, the signal charges X generated in the n-type region 103a is read out from the channel forming layer 109 along the n-type penetration channel layer 107 towards the detection node section 104.

FIG. 13 is a longitudinal cross sectional view schematically illustrating an exemplary essential part structure of a conventional solid-state image capturing element disclosed in Reference 2.

In FIG. 13, a conventional solid-state image capturing element 200 includes, as a unit pixel section 200a thereof a p-type well region 202 formed on an n-type semiconductor substrate 201; a photodiode 203 consisted of an n-type impurity region 203a and a high concentration p+ surface layer 203b on a front surface side of the n-type impurity region 203a; a transfer gate 204 for transferring signal charges accumulated in the photodiode 203; and a read out region 205 constituted of an n-type impurity region. A low concentration n-type impurity region 206 is provided extending from under the n-type impurity region 203a to the read out region 205. Further, a p-type impurity region 207 is formed at a location below the transfer gate 204. Note that 208 denotes a LOCOS oxide region for separating elements, and 209 denotes a gate oxide layer.

Reference 1: Japanese Laid-Open Publication No 11-284166

Reference 2: Japanese Laid-Open Publication No. 2003-31787

SUMMARY OF THE INVENTION

High sensitivity and wide dynamic range can be mentioned as the performance required by the conventional solid-state image capturing elements 100 and 200 described above. This sensitivity refers to light receiving sensitivity, which is a measure indicative of how much output can be obtained per unit light amount and is determined by the light focusing efficiency and photoelectric conversion efficiency. In addition, a structure capable of focusing light with an area as large as possible and performing a photoelectric conversion efficiently is necessary for high sensitivity. In the meantime, the dynamic range refers to a numerical value indicative of reproduction capacity of signals, representing the ratio of the minimum value and the maximum value of output signals, that is, the ratio of the brightest part and the darkest part. A distinct image with clear light and shade can be displayed as the dynamic range is widened. Since the dynamic range is determined by the maximum number of accumulated electrons and a noise level, it is necessary to widen a photodiode area in order to achieve the wide dynamic range. The MOS solid-state image capturing element has a low power supply voltage and thus has a small electric potential modulation below the transfer gate. When the MOS solid-state image capturing element includes a wide photodiode area to satisfy the above described performance, the distance for transferring electric charges becomes far and the complete depletion of the photodiode becomes difficult. As a result, the complete electric charge transferring may not be possible for the conventional solid-state image capturing elements 100 and 200.

More particularly, while the pixel size is 2×2 for a camera equipped in a cell phone device, it is necessary to enlarge the pixel size to 6×6 µm to widen the photodiode area for an IP camera used for a monitoring camera mounted in a vehicle or at the entrance of a house and a television telephone device since such a camera mainly takes video shooting and needs to achieve sensitivity and wide dynamic range.

The present invention is intended to solve the conventional problems described above. The objective of the present invention is to provide: a solid-state image capturing element capable of easily performing the complete electric charge transferring even with a wide photodiode area; and an electronic information device, such as a car-mounted back view monitoring camera and a television telephone camera, including the solid-state image capturing element as an image input device used in an image capturing section thereof.

A solid-state image capturing element according to the present invention includes: a one conductivity type semiconductor substrate; an opposite conductivity type well region formed on the one conductivity type semiconductor substrate; a photodiode section formed on the opposite conductivity type well region, constituted of a plurality of one conductivity type regions with successively different impurity concentrations for complete electric charge transferring; a one conductive drain region capable of reading out signal charges from the photodiode section; and a transfer gate formed above a substrate between the one conductivity drain region and the photodiode section, thereby achieving the objective described above.

Preferably, in a solid-state image capturing element according to the present invention, the plurality of one conductivity type regions constituting the photodiode section are constituted of n stages (n being a natural number of 2 or above) of impurity concentration regions, including a first one conductivity type region proximal to the transfer gate; a second one conductivity type region covering the outside of the first one conductivity type region excluding the transfer gate side thereof, . . . and an $n^{th}$ one conductivity type region covering the outside of an $(n-1)^{th}$ one conductivity type region excluding the transfer gate side thereof.

Still preferably, in a solid-state image capturing element according to the present invention, each of the plurality of one conductivity type regions has an incrementally and successively lower one conductivity impurity concentration according to the distance from the transfer gate.

Still preferably, in a solid-state image capturing element according to the present invention, each of the plurality of one conductivity type regions has an incrementally and successively higher one conductivity impurity concentration according to the distance towards the transfer gate.

Still preferably, in a solid-state image capturing element according to the present invention, in the plurality of one conductivity type regions constituting the photodiode section, a potential inclination is provided incrementally or successively towards the side of an electric charge transferring path below the transfer gate.

Still preferably, in a solid-state image capturing element according to the present invention, the $n^{th}$ one conductivity type region covers an $(n-1)^{th}$ one conductivity type region on the outside in a substrate surface direction.

Still preferably, in a solid-state image capturing element according to the present invention, the $n^{th}$ one conductivity type region covers an $(n-1)^{th}$ one conductivity type region on the outside in a substrate depth direction.

Still preferably, in a solid-state image capturing element according to the present invention, the $n^{th}$ one conductivity type region covers an $(n-1)^{th}$ one conductivity type region on the outside in both substrate surface direction and a substrate depth direction.

Still preferably, in a solid-state image capturing element according to the present invention, when the photodiode section is constituted of a first one conductivity type region and a second one conductivity type region, an impurity concentration N of the first one conductivity type region is set as $N=5\times10^{16}$ to $1\times10^{17}$ cm$^{-3}$, and an impurity concentration $N--$ of the second one conductivity type region is set as $N--=1\times10^{14}$ cm$^{-3}$.

Still preferably, in a solid-state image capturing element according to the present invention, when the photodiode section is constituted of a first one conductivity type region and a second one conductivity type region, an impurity concentration N of the first one conductivity type region is set as $N=5\times10^{16}$ to $1\times10^{17}$ cm$^{-3}$, and an impurity concentration $N-$ of the second one conductivity type region is set as $N-=1\times10^{15}$ to $1\times10^{16}$ cm$^{-3}$.

Still preferably, in a solid-state image capturing element according to the present invention, when the photodiode section is constituted of a first one conductivity type region, a second one conductivity type region and a third one conductivity type region, an impurity concentration N of the first one conductivity type region is set as $N=5\times10^{16}$ to $1\times10^{17}$ cm$^{-3}$, an impurity concentration $N-$ of the second one conductivity type region is set as $N-=1\times10^{15}$ to $1\times10^{16}$ cm$^{-3}$, and an impurity concentration $N--$ of the third one conductivity type region is set as $N--=1\times10^{14}$ cm$^{-3}$.

Still preferably in a solid-state image capturing element according to the present invention, when the photodiode section is constituted of a first one conductivity type region, a second one conductivity type region, a third one conductivity type region and a fourth one conductivity type region, an impurity concentration N of the first one conductivity type region is set as $N=5\times10^{16}$ to $1\times10^{17}$ cm$^{-3}$, an impurity concentration $N1-$ of the second one conductivity type region is set as $N1-=5\times10^{15}$ to $1\times10^{16}$ cm$^{-3}$, an impurity concentration $N2-$ of the third one conductivity type region is set as $N2-=5\times10^{14}$ to $1\times10^{15}$ cm$^{-3}$, and an impurity concentration $N--$ of the fourth one conductivity type region is set as $N--=1\times10^{14}$ cm$^{-3}$.

Still preferably, in a solid-state image capturing element according to the present invention, the size of the photodiode section is between 3×3 µm to 10×10 µm.

Still preferably, in a solid-state image capturing element according to the present invention, the impurity concentration of the one conductivity type region of the photodiode section farthest from the transfer gate is equal to the impurity concentration of the one conductivity type semiconductor substrate.

Still preferably, in a solid-state image capturing element according to the present invention, two or more kinds of impurity ions are used to form the plurality of one conductivity type regions constituting the photodiode section.

Still preferably, in a solid-state image capturing element according to the present invention, of the plurality of one conductivity type regions constituting the photodiode section, arsenic and phosphorus are implanted as the impurity ions into one of the regions closer to the transfer gate and phosphorus only is implanted as the impurity ion into one of the regions farther away from the transfer gate.

Still preferably, a solid-state image capturing element according to the present invention further includes an opposite conductivity type high concentration surface layer formed above the photodiode section in such a manner to bury the photodiode section.

Still preferably, in a solid-state image capturing element according to the present invention, an opposite conductivity type barrier layer is formed between the one conductivity type drain region and the photodiode section, and the transfer gate is formed above the opposite conductivity type barrier layer.

An electronic information device according to the present invention includes the solid-state image capturing element according to the present invention used as an image input device in an image capturing section, thereby achieving the objective described above.

The functions of the present invention having the structures described above will be described hereinafter.

The solid-state image capturing element according to the present invention includes: a one conductivity type semiconductor substrate; an opposite conductivity type well region formed on the one conductivity type semiconductor substrate; a photodiode section constituted of a plurality of one conductivity type regions with successively different impurity concentrations for the complete electric charge transferring, formed on the opposite conductivity type semiconductor substrate; a one conductivity type drain region capable of reading out signal charges from the photodiode section; and a transfer gate formed above a substrate between the one conductivity type drain region and the photodiode section.

Thus, a potential inclination is provided towards the transfer gate with the plurality of impurity areas of incrementally changing impurity concentrations in the photodiode section in such a manner that the impurity concentration incrementally successively increases as the potential inclination comes closer to the transfer gate. Therefore, it becomes possible to move signal charges obtained by photoelectric conversions on incident light to the side with stronger potential, that is, a location proximal to the transfer gate of the photodiode, without residing on the way. As a result, the complete electric charge transferring can be performed more easily even when the pixel size is changed from the conventional minute 2×2 µm size, to a 3×3 µm to 10×10 µm size to widen the photodiode area particularly for the IP camera used for a monitoring camera and a television telephone camera, which mainly takes video shooting and needs to achieve sensitivity and wide dynamic range.

According to the present invention with the structures described above, a potential inclination is provided towards the transfer gate with the plurality of impurity regions of incrementally changing impurity concentrations in the photodiode section in such a manner that the impurity concentration incrementally successively increases as the potential inclination comes closer to the transfer gate. Therefore, the complete electric charge transferring can be performed more easily even when the photodiode area is large.

These and other advantages of the present invention will become apparent to those skilled in the art upon reading and understanding the following detailed descriptions with references to the accompanying figures.

Figure 1:
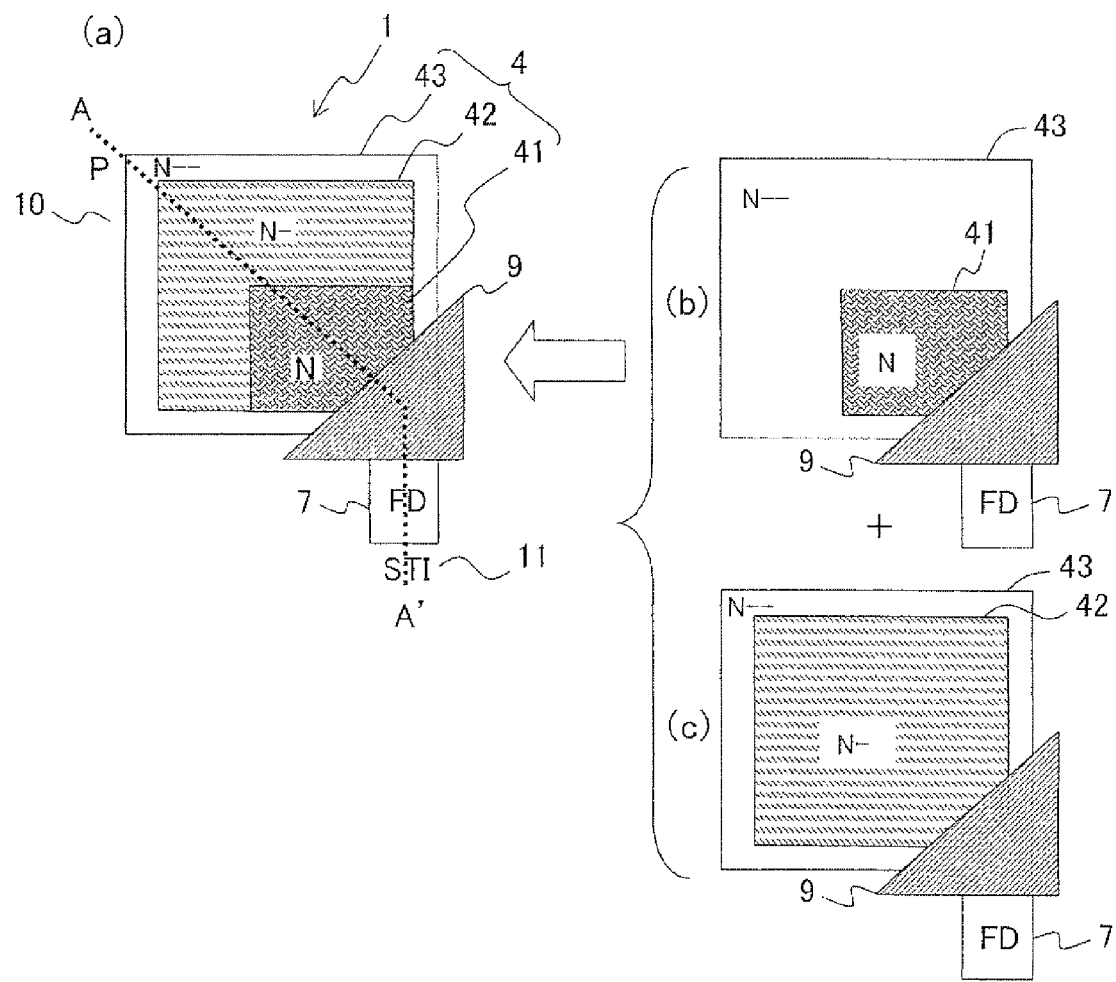
FIG. 1(a) is a plan view schematically illustrating an exemplary unit photodiode structure of a solid-state image capturing element according to Embodiment 1 of the present invention.
FIGS. 1(b) and 1(c) each are a plan view of an expanded photodiode section in FIG. 1(a).

1, 1B, 1C solid-state image capturing element
2 N type silicon substrate
3 P well region
4, 4B, 4C photodiode section (PD)
41, 41B, 41C electric charge transfer gate proximal N area
42 N– region
421 N1– region
422 N2– region
43 N–– region
5 P type high concentration surface layer
6 P type well region
7 N type drain region (FD)
8 P type barrier layer
9 transfer gate
10 P type element separation region
11 element separating insulation region
N impurity concentration of electric charge transfer gate proximal N region
N– impurity concentration of N– region
N1– impurity concentration of N1– region
N2– impurity concentration of N2– region
N–– impurity concentration of N– region
N+ impurity concentration of N type drain region (FD)
90 electronic information device
91 solid-state image capturing apparatus
92 memory section
93 display section
94 communication section
95 image output section

DESCRIPTION OF THE PREFERRED EMBODIMENTS

Hereinafter, Embodiments 1 to 3 of the solid-state image capturing element of the present invention, and Embodiment 4 of an electronic information device, such as a car-mounted back view monitoring camera and a television telephone camera, including the solid-state image capturing element as an image input device used in an image capturing section thereof, will be described in detail with reference to the attached drawings.

(Embodiment 1)

Figure 2:
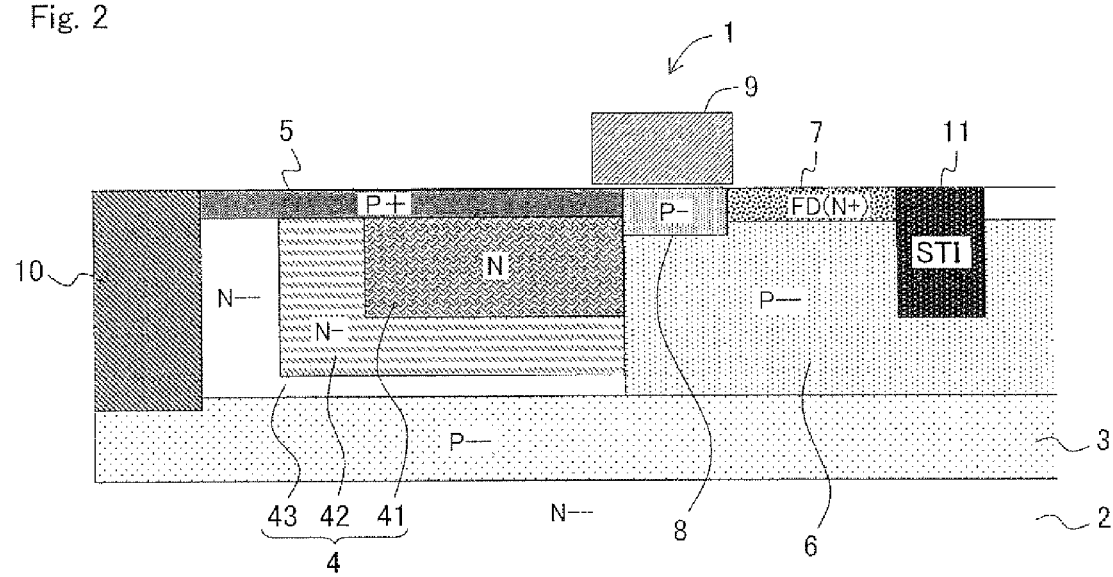
FIG. 2 is a longitudinal cross sectional view of the solid-state image capturing element in FIG. 1 along the line A-A'.

FIG. 1(a) is a plan view schematically illustrating an exemplary unit photodiode structure of a solid-state image capturing element according to Embodiment 1 of the present invention. FIG. 2 is a longitudinal cross sectional view of the solid-state image capturing element in FIG. 1 along the line A-A'. In addition, FIGS. 1(b) and 1(c) each are a plan view of an expanded photodiode section in FIG. 1(a).

In FIGS. 1(a) and 2, a solid-state image capturing element 1 of Embodiment 1 includes: a P type well region 3 formed on an N type silicon substrate 2; a photodiode section 4 formed on the P type well region 3 and constituted of a plurality of N type regions (three regions, herein) with increasing impurity concentration towards a later-described transfer gate 9; a P type high concentration surface layer 5 formed above the photodiode section 4 and being a p+ surface layer for reducing dark current; an N type drain region 7 (FD 7) formed in a P type well region 6 formed above the P type well region 3, as a floating diffusion FD formed at a location proximal to an N type region for reading out signal charges from the photodiode section 4; a P type barrier layer 8 formed in a P type well region 6 formed above the P type well region 3, and capable to control a channel region formed between the N type drain region 7 and the photodiode section 4; and a transfer gate 9 provided with a gate insulation film (not shown) interposed therebetween above the P type barrier layer 8.

The photodiode section 4 is constituted of three stages of impurity concentration regions with successively varying impurity concentrations, including: an electric charge transfer gate proximal N region 41 with high N type impurity concentration; an N– region 42 provided to cover the outside of the electric charge transfer gate proximal N region 41 (excluding the transfer gate 9 side), with intermediate N type impurity concentration; and an N−− region 43 provided to further cover the outside of the N− region 42 (excluding the transfer gate 9 side), with low N type impurity concentration. The magnitude of the N type impurity concentration is N−−<N−<N.

More particularly, the N type impurity concentration is set as follows: N=$5 \times 10^{16}$ to $1 \times 10^{17}$ cm$^{-3}$ in the electric charge transfer gate proximal N region 41, for example; N−=$1 \times 10^{15}$ to $1 \times 10^{16}$ cm$^{-3}$ in the N− region 42, for example; and N−−=$1 \times 10^{14}$ cm$^{-3}$ in the N−− region 43, for example. Further, in detail, the photodiode section 4 is consisted of: the electric charge transfer gate proximal N region 41 in which arsenic (As) and phosphorus (P) are ion-implanted as impurities; the N− region 42 on the outside thereof in which phosphorus is ion-implanted; and the N−− region 43 with the N type impurity concentration (N−−) of the silicon substrate 2 and has no new ion implantations.

First, phosphorus (P) ions are implanted as impurities to form the N− region 42 as illustrated in FIG. 1(c), and next, arsenic (As) ions are implanted as impurities to form the electric charge transfer gate proximal N region 41 as illustrated in FIG. 1(b). Alternately, phosphorus (P) ions are implanted as impurities to form the N− region 42 as illustrated in FIG. 1(c). No new ions are further implanted in the third, N−− region 43, and the N type silicon substrate 2 remains as is.

Conversely, it is also possible to implant arsenic (As) ions as impurities to form the N− region 42 as illustrated in FIG. 1(c), and next to implant phosphorus (P) ions as impurities to form the electric charge transfer gate proximal N region 41 as illustrated in FIG. 1(b). Alternately, it is also possible to implant phosphorus (P) ions as impurities to form the electric charge transfer gate proximal N region 41 as illustrated in FIG. 1(b) and next to implant arsenic (As) ions as impurities to form the N− region 42 as illustrated in FIG. 1(c). However, arsenic (As)) as N type impurities are difficult to diffuse compared to phosphorus (P) after ion implantation whereas phosphorus (P) as N type impurities are easy to diffuse compared to arsenic (As). Therefore, it is more preferable to implant arsenic (As)) ions into the electric charge transfer gate proximal N region 41, where the potential for determining the accumulating capacity of the signal charges is the strongest, and to implant phosphorus (P) into the N− region 42 to diffuse the ions evenly in a wider area.

In the meantime, N+ impurity concentrations of the electric charge transfer gate proximal N region 41 and the N type drain region 7, which is a floating diffusion FD opposing the region 41 with the P type barrier layer 8 interposed therebetween, is of high concentration of $1 \times 10^{18}$ to $1 \times 10^{19}$ cm$^{-3}$, for example.

Further, a P type element separating region 10 and an element separating insulation region 11, which are channel stop regions, are formed on the substrate surface side surrounding element areas between the photodiode section 4 and the detection node 7 (FD 7) with the P type barrier layer 8 below the transfer gate 9 interposed therebetween, for element separation as a unit pixel area.

Figure 3:
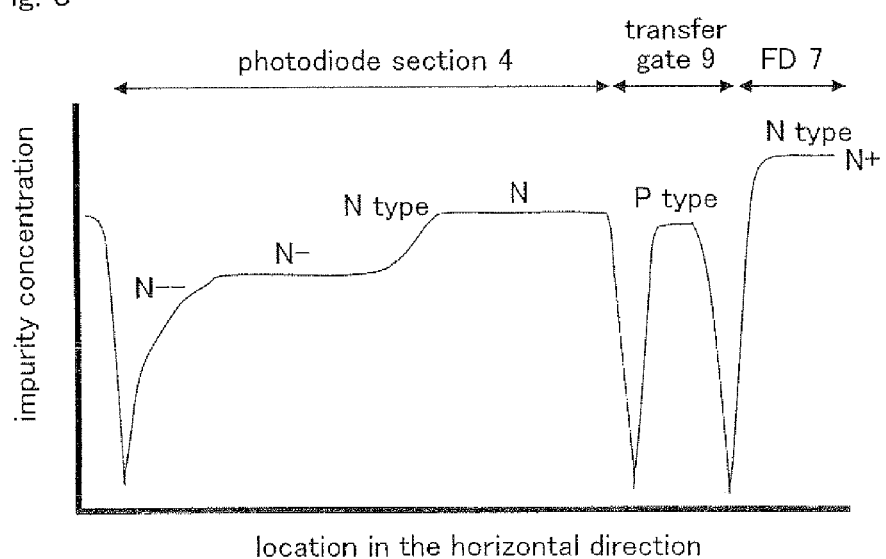
FIG. 3 is a graph schematically illustrating an impurity profile with respect to a horizontal direction location in the solid-state image capturing element of Embodiment 1.

FIG. 3 is a graph schematically illustrating an impurity profile with respect to a horizontal direction location (substrate surface direction location) in the solid-state image capturing element 1 of Embodiment 1.

As illustrated in FIG. 3, the photodiode section 4 includes the electric charge transfer gate proximal N region 41, the N− region 42 and the N−− region 43 incrementally provided so that the impurity concentration becomes lower according to the distance from the transfer gate 9. The N type impurity concentration of the N−− region 43 on the one end of the photodiode 4 is equal to the impurity concentration of the N type silicon substrate 2. As previously described, although the impurity ion implantation is performed into the area of the P well region 3 to form the P well region 3, the area of the N−− region 43 remains the same as the area of the N type silicon substrate 2 where the impurity ion implantation is not performed.

Figure 4:
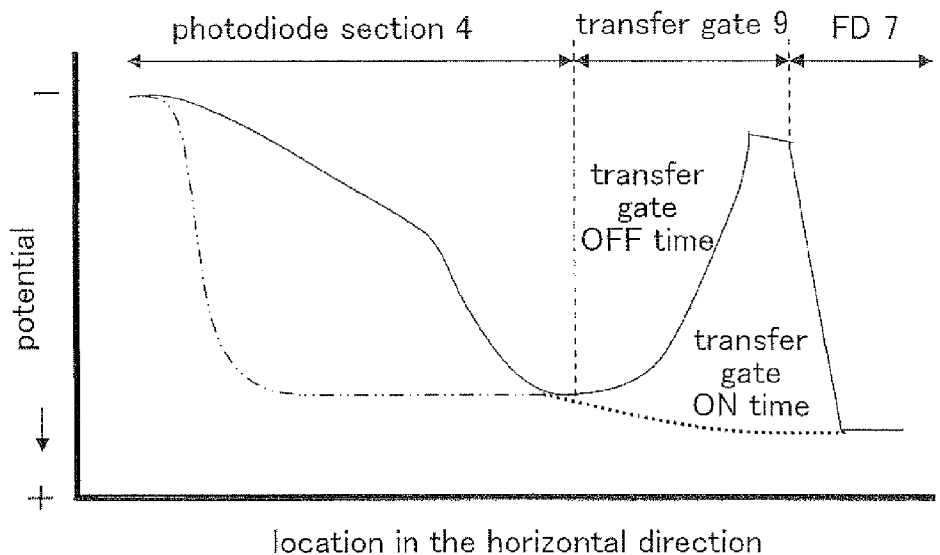
FIG. 4 is a graph schematically illustrating potential with respect to the horizontal direction location of the solid-state image capturing element of Embodiment 1.

FIG. 4 is a graph schematically illustrating potential with respect to the horizontal direction location of the solid-state image capturing element 1 of Embodiment 1.

Since the impurity concentration is incrementally and successively increased from the N−− region 43 to the N− region 42 and further to the electric charge transfer gate proximal N region 41, as it gets closer to the transfer gate 9, the potential inclination is provided in the substrate surface direction towards the transfer gate 9 as illustrated in FIG. 4. Therefore, the signal charges obtained by photoelectric conversions on incident light can be moved to the stronger potential, that is, to the location proximal to the transfer gate 9 of the photodiode 4, without residing on the way. Thus, even if the pixel size is enlarged to 6×6 μm to widen the photodiode area particularly for an IP camera used for a monitoring camera and a television telephone device since such a camera mainly takes video shooting and needs to achieve sensitivity and wide dynamic range, the complete electric charge transferring can be more easily performed.

On the contrary, in the case where only the electric charge transfer gate proximal N region 41 is provided and the impurity concentration does not vary as in the conventional References 1 and 2, the chain double-dashed line extends flat for a while towards the left side of FIG. 4 (direction away from the transfer gate 9), and subsequently, the line moves upwards as similar to the potential curve below the transfer gate 9 (at a transfer gate off time). In this case, if the photodiode area is relatively large, the signal charges remain at the portion where the potential is flat and the complete electric charge transferring cannot be achieved. In summary, although References 1 and 2 propose a method for reducing a potential barrier directly below the transfer gate, which can be an obstruction for the complete electric charge transferring, such a method cannot be a solution for the poor electric charge transferring caused by enlarging the photodiode area. On the other hand, Embodiment 1 proposes the photodiode structure that facilitates the complete electric charge transferring as previously described.

Figure 5:
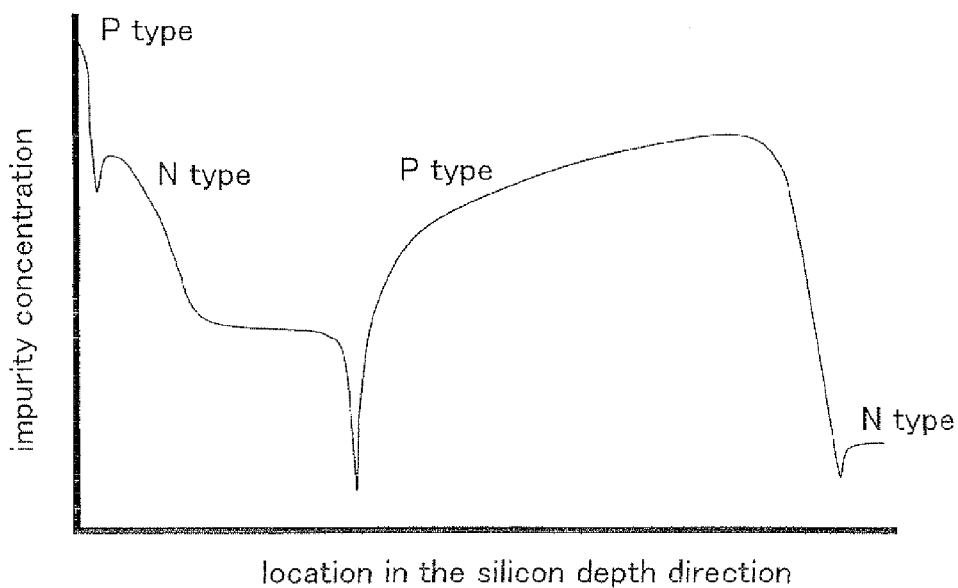
FIG. 5 is a graph schematically illustrating an impurity profile with respect to the substrate depth direction location of the solid-state image capturing element of Embodiment 1.
Figure 6:
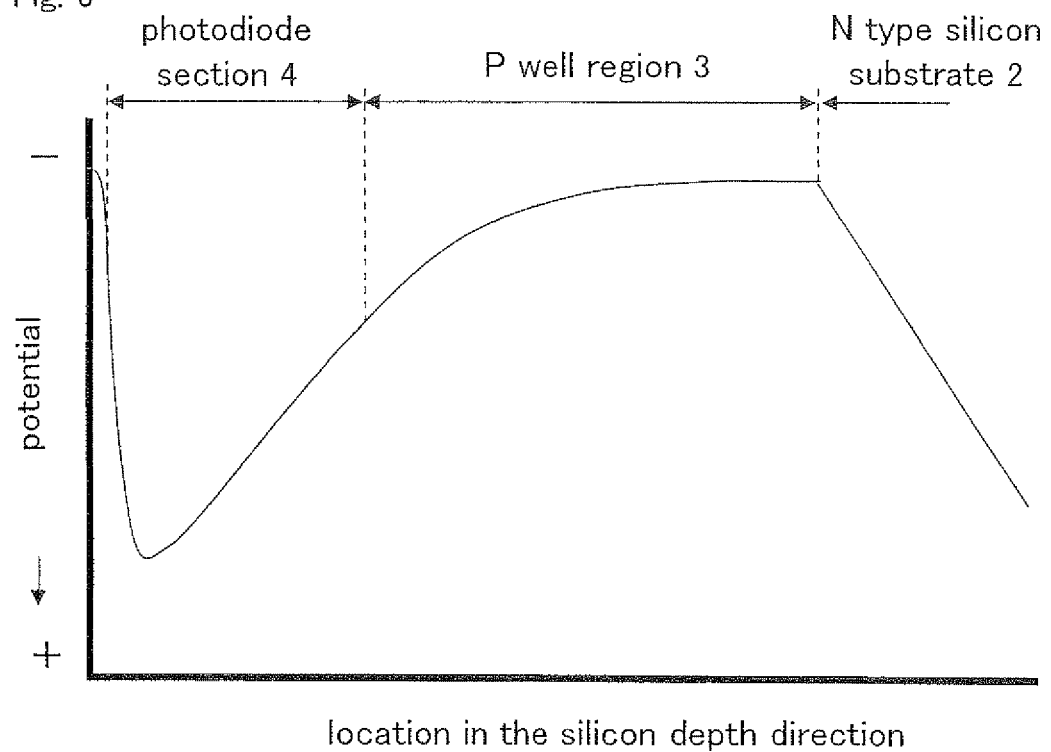
FIG. 6 is a graph schematically illustrating potential with respect to the substrate depth direction location of the solid-state image capturing element of Embodiment 1.

FIG. 5 is a graph schematically illustrating an impurity profile with respect to the substrate depth direction location of the solid-state image capturing element 1 of Embodiment 1. FIG. 6 is a graph schematically illustrating potential with respect to the substrate depth direction location of the solid-state image capturing element 1 of Embodiment 1. That is, FIG. 6 is a graph illustrating potential with respect to the impurity profile of FIG. 5.

As illustrated in FIG. 6, the inclination is provided such that the potential successively becomes stronger towards the electric charge transfer gate proximal N region 41 side of upper side of the substrate, or towards the substrate depth direction from the P well region 3 to the N−− region 43 and further to the N− region 42, and further to the electric charge transfer gate proximal N region 41. By the potential inclination, it is also possible to widely collect the signal charges from the P well region 3. That is, the signal charges can be moved more smoothly to the location proximal to the transfer gate 9 of the photodiode 4 without residing in the middle of the photodiode 4, and thus, even if the pixel size is enlarged to 6×6 μm to widen the photodiode area particularly for an IP camera used for a monitoring camera and a television telephone device since such a camera mainly takes video shooting and needs to achieve sensitivity and wide dynamic range, the complete electric charge transferring can be more easily performed from the photodiode 4.

As described above, the photodiode section 4 in the solid-state image capturing element 1 of Embodiment 1 is configured of the three stages of the impurity concentrations, N, N− and N−−, and the side close to the transfer gate 9 has the highest impurity concentration.

The magnitude of the N type impurity concentration is N−−<N−<N<N+. In the meantime, the potential becomes stronger towards the transfer gate 9, and the location proximal to the side wall of the transfer gate 9 is the point with the strongest potential. The signal charges on which photoelectric conversion are performed in the larger photodiode 4 are collected smoothly to this point in the horizontal direction (substrate surface direction) and the vertical direction (substrate depth direction), and the complete electric charge transferring is performed for the collected signal charges from the photodiode 4.

As described above, the potential becomes stronger towards the side of the transfer gate 9, and the location proximal to the side wall of the transfer gate 9 becomes the point with the strongest potential. Therefore, even with the photodiode 4 having a wide area to maintain the number of saturation electrons sufficient to achieve the high sensitivity and wide dynamic range, the signal charges on which photoelectric conversion are performed in the photodiode 4 are collected smoothly to this point close to the transfer gate 9 without residing in the middle of the photodiode 4, and the complete electric charge transferring can be easily performed from the photodiode 4.

In Embodiment 1, the solid-state image capturing element 1 includes: the P type well region 3 formed on the N type semiconductor substrate 2; the photodiode section 4 formed above the P type well region 3 and constituted of the three N type regions (electric charge transfer gate proximal N region 41, N− region 42 and N−− region 43); the N type drain region 7 formed at a location proximal to the N type region of the photodiode section 4; the P type barrier layer 8 formed between the N type drain region 7 and the photodiode section 4; and the transfer gate 9 provided above the P type barrier layer 8. The three N type regions (electric charge transfer gate proximal N region 41, N− region 42 and N−− region 43) constituting the photodiode section 4 are constituted of the three stages of the impurity concentration regions, including: the electric charge transfer gate proximal N region 41 as a first one conductivity type region proximal to the transfer gate 9; the N− region 42 as a second one conductivity type region covering the outside of the electric charge transfer gate proximal N region 41 excluding the transfer gate 9 side thereof; and the N− region 43 as a third one conductivity type region covering the outside of the N− region 43 excluding the transfer gate 9 side thereof. Each of the N type regions is set to have a lower N type impurity concentration according to the distance from the transfer gate 9. As described above, the photodiode section 4 is constituted of the three impurity concentration regions herein; however, the photodiode section 4 may be constituted of n (n denotes a natural number of 2 or above) stages of impurity concentration regions. In the following Embodiment 2, the case will be described where the photodiode section 4 is constituted of two stages of the impurity concentration regions. Further, in the following Embodiment 3, the case will be described where the photodiode section 4 is constituted of four stages of the impurity concentration regions.

The n number (n stages) of N type regions constituting the photodiode section 4 are constituted of n stages of impurity concentration regions, including: a first one conductivity type area proximal to the transfer gate 9; a second one conductivity type region covering the outside of the first one conductivity type region excluding the transfer gate 9 side, . . . an $n^{th}$ one conductivity type region covering the outside of an $(n-1)^{th}$ one conductivity type region excluding the transfer gate 9 side, where each of the N type regions is set to have a lower N type impurity concentration according to the distance from the transfer gate 9. As a result, the objective of the present invention, or performing the complete electric charge transferring more easily from the photodiode 4 even with the area of the photodiode section 4 larger than the conventional 2×2 μm, can be achieved.

In Embodiment 1, it is described that the $n^{th}$ one conductivity type area covers the (n−1) one conductivity type region in both the substrate surface direction and the surface depth direction. However, without the limitation to this, in either the case where the $n^{th}$ one conductivity type region covers the $(n-1)^{th}$ one conductivity type region in only the substrate surface direction or where the $n^{th}$ one conductivity type area covers the $(n-1)^{th}$ one conductivity type region in only the substrate depth direction, the objective of the present invention, or performing the complete electric charge transferring even with a widely provided photodiode area, can be achieved even.

(Embodiment 2)

Although the photodiode section 4 is constituted of the three impurity concentration regions in Embodiment 1 described above, Embodiment 2 will describe a case where the photodiode section is constituted of two stages of the impurity concentration regions.

Figure 7:
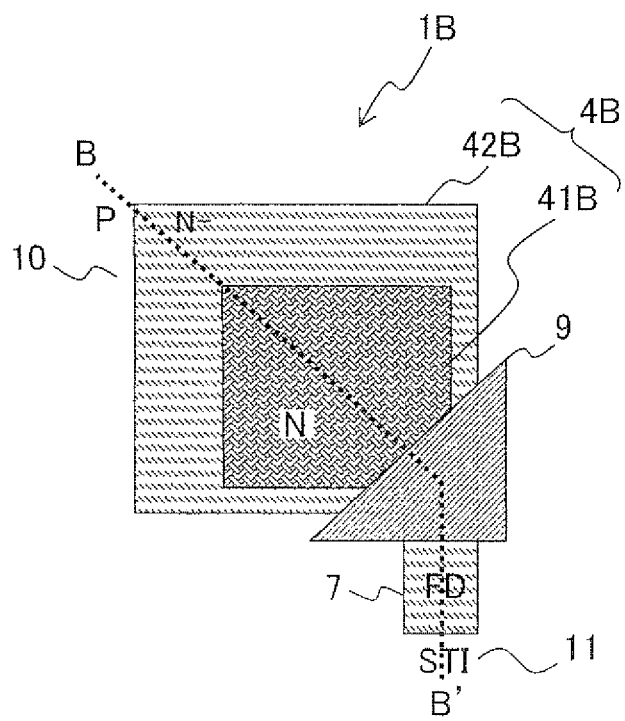
FIG. 7 is a plan view schematically illustrating an exemplary structure of a unit photodiode of a solid-state image capturing element in Embodiment 2 of the present invention.
Figure 8:
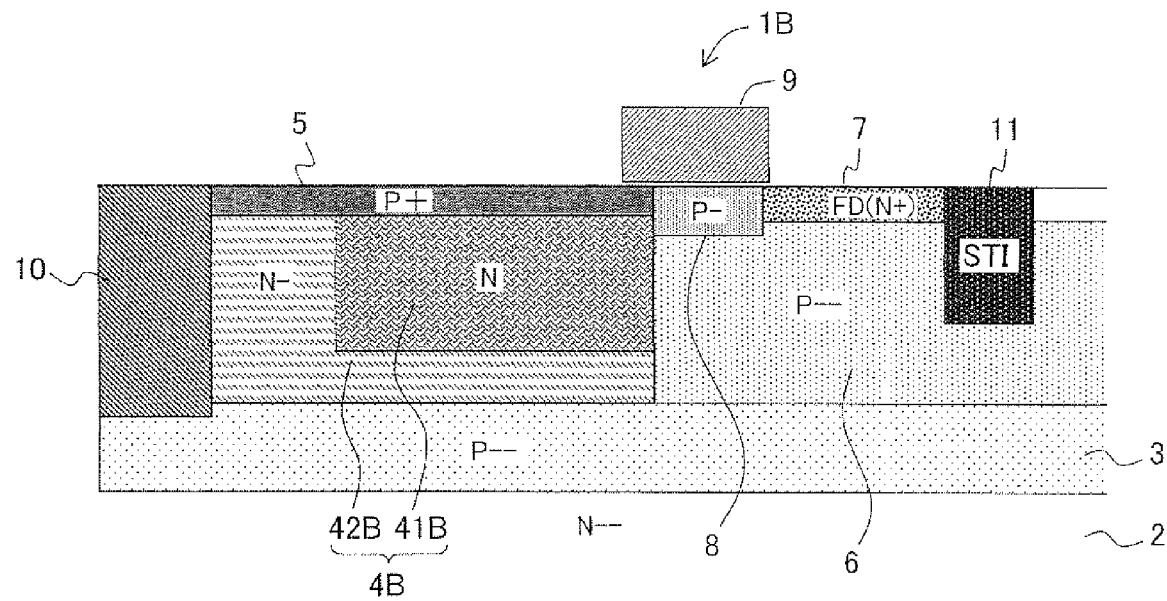
FIG. 8 is a longitudinal cross sectional view of the solid-state image capturing element in FIG. 7 along the line B-B'.

FIG. 7 is a plan view schematically illustrating an exemplary structure of a unit photodiode of a solid-state image capturing element in Embodiment 2 of the present invention. FIG. 8 is a longitudinal cross sectional view of the solid-state image capturing element in FIG. 7 along the line B-B'. In FIGS. 7 and 8, elements achieving the same working effects as the elements in FIGS. 1 and 2 are described by adding the same reference numerals.

In FIGS. 7 and 8, a solid-state image capturing element 18 of Embodiment 2 includes: a P type well region 3 formed on an N type silicon substrate 2; a photodiode section 4B formed above the P type well region 3 and constituted of later-described two N type regions with increasing impurity concentration towards the transfer gate 9; a P type high concentration surface layer 5 formed above the photodiode section 4B and being a surface P+ layer for reducing dark current; an N type drain region 7 (FD 7) formed in a P type well region 6 formed above the P type well region 3, as a floating diffusion FD formed at a location proximal to an N type region for reading out signal charges from the photodiode section 4B; a P type barrier layer 8 formed in a P type well region 6 formed above the P type well region 3, and capable to control a channel region formed between the N type drain region 7 and the photodiode section 4B; and a transfer gate 9 provided with a gate insulation film (not shown) interposed therebetween above the P type barrier layer 8.

The photodiode section 4B is constituted of two stages of impurity concentration regions of an electric charge transfer gate proximal N region 41B and an N− region 42B provided to cover the outside of the electric charge transfer gate proximal N region 41B (excluding the side of transfer gate 9). The magnitude of the N type impurity concentration is N−<N. More specifically, the N type impurity concentration is N=5× $10^{16}$ to $1 \times 10^{17}$ cm$^{-3}$, for example, in the electric charge transfer gate proximal N region 41B; and the N type impurity concentration is N−=$1 \times 10^{15}$ to $1 \times 10^{16}$ cm$^{-3}$, for example, in the N− region 42B. Further, in detail, the photodiode section 4B is consisted of: the electric charge transfer gate proximal N region 41B in which arsenic (As) and phosphorus (P) are ion-implanted as impurities; and the N− region 42B on the outside thereof in which phosphorus is ion-implanted as an impurity.

In the meantime, the N+ impurity concentration of the electric charge transfer gate proximal N region 41B and the N type drain region 7, which is a floating diffusion FD opposing the P type barrier layer 8 interposed therebetween, is high concentration of $1 \times 10^{18}$ to $1 \times 10^{19}$ cm$^{-3}$, for example, as similar to the case in Embodiment 1 described above.

As described above, the photodiode 4B is constituted of two stages of impurity concentrations in the solid-state image capturing element 1B of Embodiment 2, and the impurity concentration is higher on the side close to the transfer gate 9. The magnitude of the N type impurity concentration is N−<N<N+. Meanwhile, the potential becomes stronger towards the transfer gate 9, and the location proximal to the side wall of the transfer gate 9 is the point with the strongest potential. The signal charges on which photoelectric conversion are performed in the larger photodiode 4B are collected to this point in the horizontal direction (substrate surface direction) and the vertical direction (substrate depth direction), and the complete electric charge transferring is performed more easily for the collected signal charges from the photodiode 4.

As described above, the potential becomes stronger towards the transfer gate 9 and the location proximal to the side wall of the transfer gate 9 becomes the point with the strongest potential. Therefore, even with the photodiode 4B having a wide area to maintain the number of saturation electrons sufficient to achieve the high sensitivity and wide dynamic range, the signal charges on which photoelectric conversion are performed in the photodiode 4B are collected smoothly to this point close to the transfer gate 9 without residing in the middle of the photodiode 4B, and the complete electric charge transferring can be easily performed from the photodiode 4B.

In Embodiment 2, the case is described that the photodiode section 4B is constituted of: the electric charge transfer gate proximal N region 41B of the first one conductivity type region; and the N− region 42B of the second one conductivity type region, and the impurity concentration N of the electric charge transfer gate proximal N region 41B is set to be N=5× $10^{16}$ to $1 \times 10^{17}$ cm$^{-3}$ and the impurity concentration N− of the N− region 42B is set to be N−=$1 \times 10^{15}$ to $1 \times 10^{16}$ cm$^{-3}$. However, without the limitation to this, the impurity concentration N of the electric charge transfer gate proximal N region 41B may be set to be N=$5 \times 10^{16}$ to $1 \times 10^{17}$ cm$^{-3}$ and the impurity concentration N−− of an N−− region 42B' may be set to be as much as N−=$1 \times 10^{14}$ cm$^{-3}$, instead of the N− region 42B. In this case, the impurity concentration of the N−− region 42B' of the photodiode section 4B, which is the farthest from the transfer gate 9, may be equal to the impurity concentration of the N type semiconductor substrate 2.

(Embodiment 3)

In Embodiment 1 described above, the photodiode section 4 is constituted of the three stages of impurity concentration regions. In Embodiment 3, the case will be described where a photodiode section is constituted of four stages of impurity concentration regions.

Figure 9:
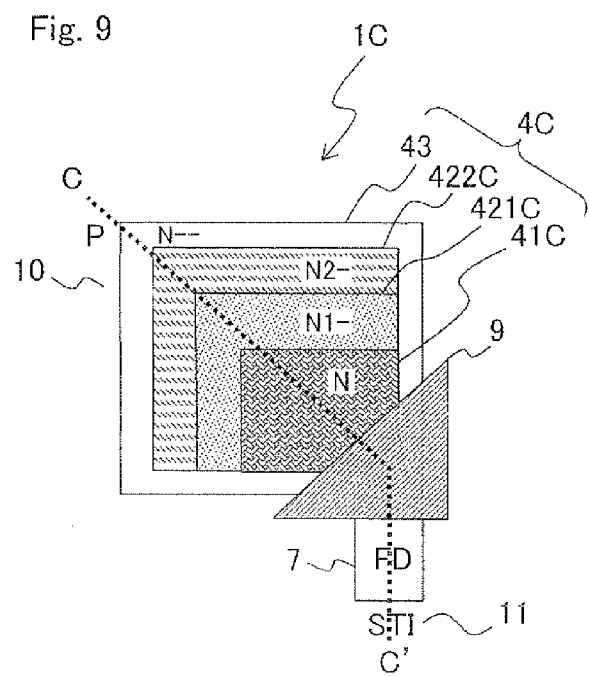
FIG. 9 is a plan view schematically illustrating an exemplary structure of a unit photodiode of a solid-state image capturing element in Embodiment 3 of the present invention.
Figure 10:
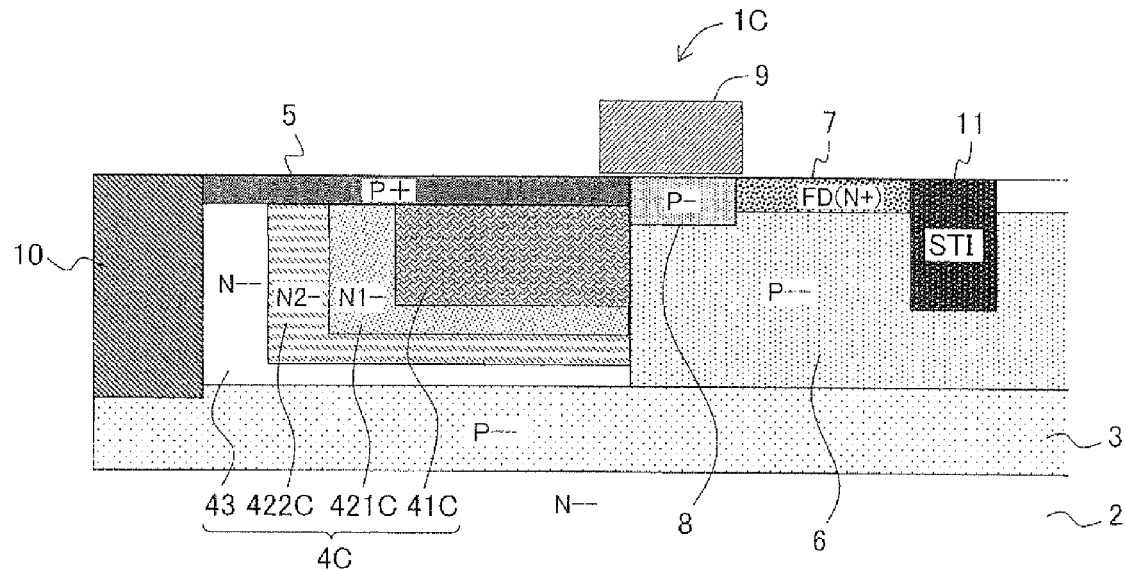
FIG. 10 is a longitudinal cross sectional view of the solid-state image capturing element in FIG. 9 along the line C-C'.

FIG. 9 is a plan view schematically illustrating an exemplary structure of a unit photodiode of a solid-state image capturing element in Embodiment 3 of the present invention. FIG. 10 is a longitudinal cross sectional view of the solid-state image capturing element in FIG. 9 along the line C-C'. In FIGS. 9 and 10, elements achieving the same working effects as the elements in FIGS. 1 and 2 are described by adding the same reference numerals.

In FIGS. 9 and 10, a solid-state image capturing element 1C of Embodiment 3 includes: a P type well region 3 formed on an N type silicon substrate 2; a photodiode section 4C formed above the P type well region 3 and constituted of four N type regions with increasing impurity concentration towards the side of a later-described transfer gate 9; a P type high concentration surface layer 5 formed on the photodiode section 4C and being a surface P+ layer for controlling dark current; an N type drain region 7 (FD 7) formed in a P type well region 6 formed above the P type well region 3, as a floating diffusion FD formed at a location proximal to an N type region for reading out signal charges from the photodiode section 4C; a P type barrier layer 8 formed in a P type well region 6 formed above the P type well region 3, and capable to control a channel region formed between the N type drain region 7 and the photodiode section 4; and a transfer gate provided with a gate insulation film interposed therebetween above the P type barrier layer 8.

The photodiode section 4C is constituted of four stages of impurity concentration regions, including: an electric charge transfer gate proximal N region 41C; an N1− region 421C provided to cover the outside (excluding the side of transfer gate 9) of the electric charge transfer gate proximal N region 41C with impurity concentration lower than the impurity concentration of the region 41C; an N2− region 422C provided to cover the outside (excluding the side of transfer gate 9) of the N1− region 421C with impurity concentration lower than the impurity concentration of the region 421C; and an N−− region 43 provided to cover the outside (excluding the side of transfer gate 9) of the N2− region 422C with impurity concentration lower than the impurity concentration of the region 422C. The magnitude of the N type impurity concentration is N−−<N2−<N1−<N. More particularly, the N type impurity concentration is set as follows: N=$5 \times 10^{16}$ to $1 \times 10^{17}$ cm$^{-3}$ in the electric charge transfer gate proximal N region 41C, for example; N−=$5 \times 10^{15}$ to $1 \times 10^{16}$ cm$^{-3}$ in the N1− region 421C, for example; N−$5 \times 10^{14}$ to $1 \times 10^{15}$ cm$^{-3}$ in the N2− region 422C, for example; and N−−=$1 \times 10^{14}$ cm$^{-3}$ in the N−− region 43, for example. Further, in detail, the photodiode section 4C is consisted of: the electric charge transfer gate proximal N region 41C in which arsenic (As) and phosphorus (P) are ion-implanted as impurities; the N1− region 421C and N2− region 422C on the outside thereof in which phosphorus (P) is ion-implanted; and the N−− region 43 with the N type impurity concentration (N−−) of the silicon substrate 2.

In the meantime, the impurity concentration of the electric charge transfer gate proximal N region 41C and the N type drain region 7, which is a floating diffusion FD opposing the region 41C with the P type barrier layer 8 interposed therebetween, is of high concentration of $1 \times 10^{18}$ to $1 \times 10^{19}$ cm$^{-3}$, for example.

As described above, the photodiode section 4C in the solid-state image capturing element 1C of Embodiment is configured of the four stages of the impurity concentrations and the impurity concentration is formed to be higher as it gets close to the transfer gate 9. The magnitude of the N type impurity concentration is N−−<N2−<N1−<N<N+(FD) in the photodiode section 4C. In the meantime, the potential becomes stronger towards the transfer gate 9, and the location proximal to the side wall of the transfer gate 9 is the point with the strongest potential. The signal charges on which photoelectric conversion are performed in the larger photodiode 4C are collected to this point in the horizontal direction (substrate surface direction) and the vertical direction (substrate depth direction), and the complete electric charge transferring is performed more easily for the collected signal charges from the photodiode 4C.

As described above, the potential becomes stronger towards the side near the transfer gate 9, and the location proximal to the side wall of the transfer gate 9 becomes the point with the strongest potential. Therefore, even with the photodiode 4C having a wide area to maintain the number of saturation electrons sufficient to achieve the high sensitivity and wide dynamic range, the signal charges on which photoelectric conversion are performed are collected smoothly to this point close to the transfer gate 9, and the complete electric charge transferring can be easily performed from the photodiode 4C.

(Embodiment 4)

Figure 11:
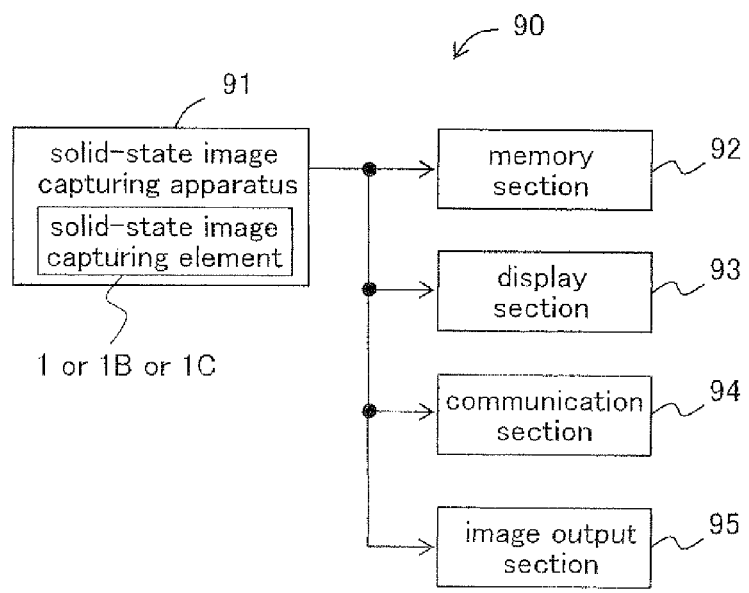
FIG. 11 is a block diagram schematically illustrating an exemplary structure of an electronic information device of Embodiment 4 of the present invention, including the solid-state image capturing element according to any of Embodiments 1 to 3 of the present invention in an image capturing section.
Figure 12:
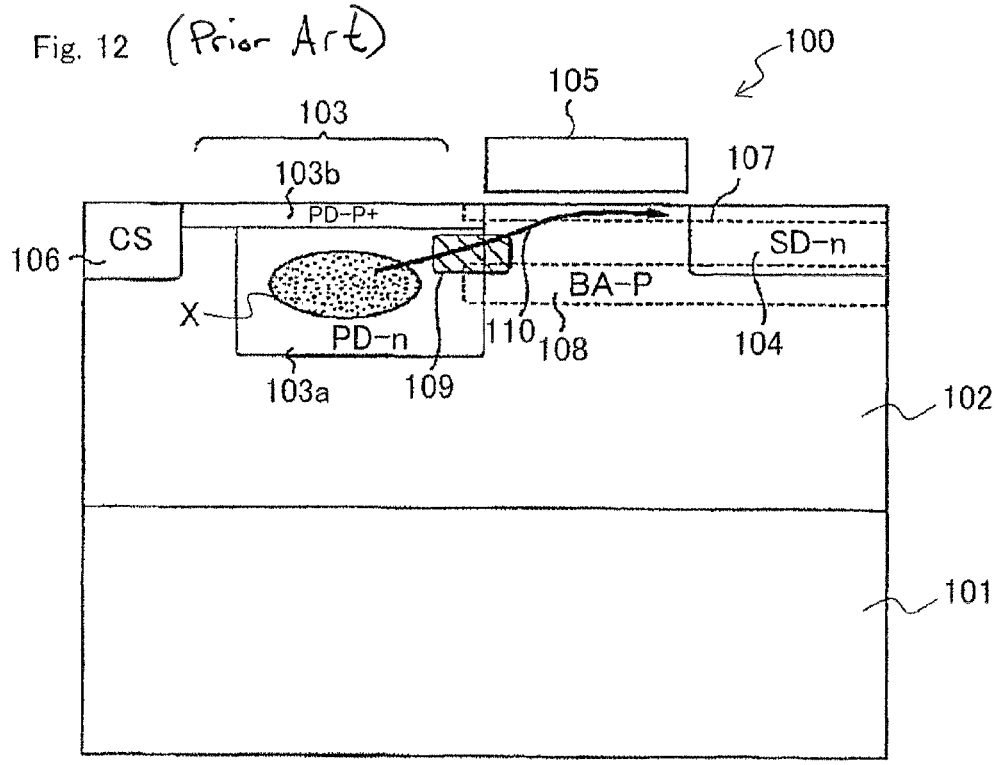
FIG. 12 is a longitudinal cross sectional view schematically illustrating an exemplary essential part structure of a conventional solid-state image capturing element disclosed in Reference 1.
Figure 13:
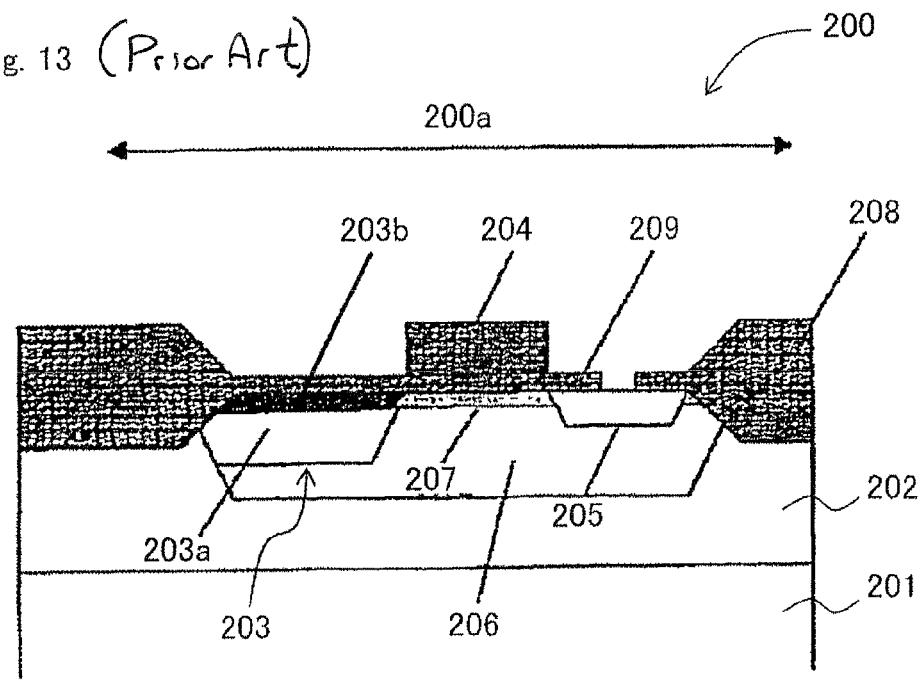
FIG. 13 is a longitudinal cross sectional view schematically illustrating an exemplary essential part structure of a conventional solid-state image capturing element disclosed in Reference 2.

FIG. 11 is a block diagram schematically illustrating an exemplary structure of an electronic information device of Embodiment 4 of the present invention, including the solid-state image capturing element according to any of Embodiments 1 to 3 of the present invention in an image capturing section.

In FIG. 11, an electronic information device 90 according to Embodiment 4 of the present invention includes: a solid-state image capturing apparatus 91 for performing predetermined signal processing on an image capturing signal from the solid-state image capturing element 1, 1B or 1C according to any of Embodiments 1 to 3 so as to obtain a color image signal; a memory section 92 (e.g., recording media) for data-recording a color image signal from the solid-state image capturing apparatus 91 after a predetermined signal process is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without the limitation to this, the electronic information device 90 may include at least any of the memory section 92, the display section 93, the communication section 94, and the image output section 95, in addition to the solid-state image capturing apparatus 91.

As the electronic information device 90, an electronic device that includes an image input device is conceivable, such as a digital camera (e.g., digital video camera or digital still camera), an image input camera (e.g., a monitoring camera, a door phone camera, a camera equipped in a vehicle such as a car-mounted back view monitoring camera, or a television camera), a scanner, a facsimile machine, a camera-equipped cell phone device or a personal digital assistant (PDA).

Therefore, according to Embodiment 4 of the present invention, the color image signal from the solid-state image capturing apparatus 91 can be: displayed on a display screen properly, printed out on a sheet of paper using an image output section 95, communicated properly as communication data via a wire or a radio by the communication section 94, stored properly at the memory section 92 by performing predetermined data compression processing; and various data processes can be properly performed.

Although not specifically described in detail in Embodiments 1 to 3 described above, the solid-state image capturing element according to the present invention includes: a one conductivity type semiconductor substrate; an opposite conductivity type well region formed on the one conductivity type semiconductor substrate; a photodiode section constituted of a plurality of one conductivity type regions with successively different impurity concentrations for the complete electric charge transferring, formed on the opposite conductivity type semiconductor substrate; a one conductivity type drain region capable of reading out signal charges from the photodiode section; and a transfer gate formed above a substrate between the one conductivity type drain region and the photodiode section. As a result, the complete electric charge transferring of signal charges can be performed more easily from the photodiode section even when the photodiode area is large.

In Embodiments 1 to 3 described above, the photodiode section 4 is constituted of two to four stages of impurity concentration regions with successively varying impurity concentrations for the complete electric charge transferring. However, without the limitation to this, the photodiode section 4 may be configured of five or more stages of a plurality of impurity concentration regions with successively varying impurity concentrations for the complete electric charge transferring. Herein, two to four stages of impurity concentration regions are included so that the signal charges can be moved more smoothly to the location proximal to the transfer gate 9 of the photodiode section 4, without residing in the middle of the photodiode 4. Thus, even if the pixel size is enlarged to 6×6 μm to widen the photodiode area particularly for an IP camera used for a monitoring camera and a television telephone device since such a camera mainly takes video shooting and needs to achieve sensitivity and wide dynamic range, the complete electric charge transferring can be more easily performed from the photodiode section. There may be a case where the photodiode section 4 needs to be constituted of five or more stages of a plurality of impurity concentration regions as the photodiode area widens more than the conventional 2×2 μm, such as 3×3 μm to 10×10 μm.

Therefore, the complete electric charge transferring can be performed more easily even when the photodiode area (pixel size) is larger than the conventional pixel size of 2×2 μm, such as 3×3 μm to 10×10 μm.

Further, in Embodiments 1 to 3, the present invention includes: the P type well region 3 formed on the N type semiconductor substrate 2; the photodiode section formed above the P type well region 3 and constituted of a plurality of (n number) N type regions; the N type drain region 7 formed at a location proximal to the N type region of the photodiode section 4; the P type barrier layer 8 formed between the N type drain region 7 and the photodiode section; and the transfer gate 9 provided above the P type barrier layer 8. The plurality of (n number) N type areas constituting the photodiode section are constituted of the n number of stages of impurity concentration regions, including: the first N type region proximal to the transfer gate 9; the second N type region covering the outside of the first N type region excluding the transfer gate 9 side thereof . . . and the $n^{th}$ N type region covering the outside of the (n−1) N type region excluding the transfer gate 9 side thereof. Each of the N type regions is set to have a lower N type impurity concentration according to the distance from the transfer gate 9. However, without the limitation to this, the conductivity type may be an opposite conductivity type.

That is, the present invention includes: an N type well region formed on a P type semiconductor substrate; a photodiode section formed above the N type well region and constituted of a plurality of (n number) P type regions; a P type drain region formed at a location proximal to the P type region of the photodiode section; an N type barrier layer formed between the P type drain region and the photodiode section; and a transfer gate 9 provided above the N type barrier layer. The plurality of (n number) P type regions constituting the photodiode section are constituted of the n number of stages of impurity concentration regions, including: a first P type region proximal to the transfer gate 9; a second P type region covering the outside of the first P type region excluding the transfer gate 9 side thereof . . . and the $n^{th}$ P type region covering the outside of the (n−1) P type region excluding the transfer gate 9 side thereof. Each of the P type regions is necessary to be set to have a lower P type impurity concentration according to the distance from the transfer gate 9.

As described above, the present invention is exemplified by the use of its preferred Embodiments 1 to 4. However, the present invention should not be interpreted solely based on Embodiments 1 to 4 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 4 of the present invention. Furthermore, it is understood that any patent, any patent application and any references cited in the present specification should be incorporated by reference in the present specification in the same manner as the contents are specifically described therein.

Industrial Applicability

The present invention can be applied in the field of a solid-state image capturing element, such as a MOS solid-state image capturing element, constituted of a semiconductor element for performing a photoelectric conversion on and capturing an image of image light from a subject, and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing element as an image input device used in an image capturing section thereof. According to the present invention, a potential inclination is provided towards the transfer gate with the plurality of impurity regions of incrementally changing impurity concentrations in the photodiode section in such a manner that the impurity concentration incrementally successively increases as the potential inclination comes closer to the transfer gate. Therefore, it becomes possible to move signal charges obtained by photoelectric conversions on incident light to the side with stronger potential, that is, a location proximal to the transfer gate of the photodiode, without residing in the middle of the photodiode section. As a result, the complete electric charge transferring of the signal charges can be performed more easily from the photodiode section even when the pixel size is changed to as large as a 6×6 μm size to widen the photodiode area particularly for the IP camera used for a monitoring camera and a television telephone camera, which mainly takes video shooting and needs to achieve sensitivity and wide dynamic range.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing element, comprising:
   a one conductivity type semiconductor substrate;
   an opposite conductivity type well region formed on the one conductivity type semiconductor substrate;
   a photodiode section formed on the opposite conductivity type well region, constituted of a plurality of one conductivity type regions with successively different impurity concentrations for complete electric charge transferring;
   a one conductive drain region capable of reading out signal charges from the photodiode section;
   a transfer gate formed above a substrate between the one conductivity drain region and the photodiode section; and
   wherein the plurality of one conductivity type regions constituting the photodiode section are constituted of n stages (n being a natural number of 2 or above) of impurity concentration regions, including a first one conductivity type region proximal to the transfer gate; a second one conductivity type region covering the outside of the first one conductivity type region excluding the transfer gate side thereof, . . . and an $n^{th}$ one conductivity type region covering the outside of an $(n-1)^{th}$ one conductivity type region excluding the transfer gate side thereof.

2. A solid-state image capturing element according to claim 1, wherein each of the plurality of one conductivity type regions has an incrementally and successively lower one conductivity impurity concentration according to the distance from the transfer gate.

3. A solid-state image capturing element according to claim 1, wherein each of the plurality of one conductivity type regions has an incrementally and successively higher one conductivity impurity concentration according to the distance towards the transfer gate.

4. A solid-state image capturing element according to claim 1, wherein, in the plurality of one conductivity type regions constituting the photodiode section, a potential inclination is provided incrementally or successively towards the side of an electric charge transferring path below the transfer gate.

5. A solid-state image capturing element according to claim 1, wherein the $n^{th}$ one conductivity type region covers an $(n-1)^{th}$ one conductivity type region on the outside in a substrate surface direction.

6. A solid-state image capturing element according to claim 1, wherein the $n^{th}$ one conductivity type region covers an $(n-1)^{th}$ one conductivity type region on the outside in a substrate depth direction.

7. A solid-state image capturing element according to claim 1, wherein the $n^{th}$ one conductivity type region covers an $(n-1)^{th}$ one conductivity type region on the outside in both substrate surface direction and a substrate depth direction.

8. A solid-state image capturing element according to claim 1, wherein, when the photodiode section is constituted of a first one conductivity type region and a second one conductivity type region, an impurity concentration N of the first one conductivity type region is set as $N=5\times10^{16}$ to $1\times10^{17}\,\text{cm}^{-3}$, and an impurity concentration N−− of the second one conductivity type region is set as $N--=1\times10^{14}\,\text{cm}^{-3}$.

9. A solid-state image capturing element according to claim 1, wherein, when the photodiode section is constituted of a first one conductivity type region and a second one conductivity type region, an impurity concentration N of the first one conductivity type region is set as $N=5\times10^{16}$ to $1\times10^{17}\,\text{cm}^{-3}$, and an impurity concentration N– of the second one conductivity type region is set as $N-=1\times10^{15}$ to $1\times10^{16}\,\text{cm}^{-3}$.

10. A solid-state image capturing element according to claim 1, wherein, when the photodiode section is constituted of a first one conductivity type region, a second one conductivity type region and a third one conductivity type region, an impurity concentration N of the first one conductivity type region is set as $N=5\times10^{16}$ to $1\times10^{17}\,\text{cm}^{-3}$, an impurity concentration N– of the second one conductivity type region is set as $N-=1\times10^{15}$ to $1\times10^{16}\,\text{cm}^{-3}$, and an impurity concentration N–– of the third one conductivity type region is set as $N--=1\times10^{14}\,\text{cm}^{-3}$.

11. A solid-state image capturing element according to claim 1, wherein when the photodiode section is constituted of a first one conductivity type region, a second one conductivity type region, a third one conductivity type region and a fourth one conductivity type region, an impurity concentration N of the first one conductivity type region is set as $N=5\times10^{16}$ to $1\times10^{17}\,\text{cm}^{-3}$, an impurity concentration N1– of the second one conductivity type region is set as $N1-=5\times10^{15}$ to $1\times10^{16}\,\text{cm}^{-3}$, an impurity concentration N2– of the third one conductivity type region is set as $N2-=5\times10^{14}$ to $1\times10^{15}\,\text{cm}^{-3}$, and an impurity concentration N–– of the fourth one conductivity type region is set as $N--=1\times10^{14}\,\text{cm}^{-3}$.

12. A solid-state image capturing element according to claim 1, wherein the size of the photodiode section is between $3\times3\,\mu\text{m}$ to $10\times10\,\mu\text{m}$.

13. A solid-state image capturing element according to claim 1, wherein the impurity concentration of the one conductivity type region of the photodiode section farthest from the transfer gate is equal to the impurity concentration of the one conductivity type semiconductor substrate.

14. A solid-state image capturing element according to claim 1, wherein two or more kinds of impurity ions are used to form the plurality of one conductivity type regions constituting the photodiode section.

15. A solid-state image capturing element according to claim 14, wherein, of the plurality of one conductivity type regions constituting the photodiode section, arsenic and phosphorus are implanted as the impurity ions into one of the regions closer to the transfer gate and phosphorus only is implanted as the impurity ion into one of the regions farther away from the transfer gate.

16. A solid-state image capturing element according to claim 1, further including an opposite conductivity type high concentration surface layer formed above the photodiode section in such a manner to bury the photodiode section.

17. A solid-state image capturing element according to claim 1, wherein an opposite conductivity type barrier layer is formed between the one conductivity type drain region and the photodiode section, and the transfer gate is formed above the opposite conductivity type barrier layer.

18. An electronic information device including the solid-state image capturing element according to claim 1 used as an image input device in an image capturing section.

* * * * *